(12) United States Patent
Nishimura et al.

(10) Patent No.: US 11,451,036 B2
(45) Date of Patent: Sep. 20, 2022

(54) FIXING STRUCTURE OF WIRING MEMBER (71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Tetsuya Nishimura, Mie (JP); Ryuta Takakura, Mie (JP); Syo Shiratori, Mie (JP); Housei Mizuno, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/053,183

(22) PCT Filed: Oct. 23, 2018

(86) PCT No.: PCT/JP2018/039257
§ 371 (c)(1),
(2) Date: Nov. 5, 2020

(87) PCT Pub. No.: WO2019/225029
PCT Pub. Date: Nov. 28, 2019

(65) Prior Publication Data
US 2021/0151969 A1 May 20, 2021

(30) Foreign Application Priority Data
May 25, 2018 (JP) .............................. JP2018-100730

(51) Int. Cl.
*H02G 3/30* (2006.01)
*B60N 3/04* (2006.01)
*F16B 5/12* (2006.01)

(52) U.S. Cl.
CPC ............... *H02G 3/30* (2013.01); *B60N 3/048* (2013.01); *F16B 5/12* (2013.01)

(58) Field of Classification Search
CPC ............ H02G 3/30; H02G 3/32; H02G 3/383; H02G 3/40; H02G 3/385; H02G 3/34;
(Continued)

(56) References Cited

U.S. PATENT DOCUMENTS 3,409,858 A * 11/1968 Krehbiel ................ H01R 13/62
439/354
4,310,211 A * 1/1982 Bunnell ................... H02S 40/34
439/372
(Continued)

FOREIGN PATENT DOCUMENTS

CN 201054478 4/2008
CN 105453347 3/2016
(Continued)

OTHER PUBLICATIONS

Official Communication issued in Japan Patent Application No. 2018-100730, dated Nov. 19, 2019, together with English translation thereof.
(Continued)

*Primary Examiner* — Nkeisha Smith
(74) *Attorney, Agent, or Firm* — Greenblum & Bernstein, P.L.C.

(57) ABSTRACT

A fixing structure of the wiring member fixes the wiring member to the silencer disposed in a vehicle. The silencer includes an inserted part with one surface as an insertion surface crossing a main surface. The wiring member is disposed along the main surface of the silencer. The wiring member is fixed to the silencer by a fixing member. The fixing member includes an insertion part inserted into the inserted part from the insertion surface and an insertion state
(Continued)

maintaining part maintaining a state where the insertion part is inserted into the inserted part.

13 Claims, 5 Drawing Sheets

(58) Field of Classification Search
CPC .. H02G 3/36; H02G 3/22; H02G 3/28; H02G 3/283; B60N 3/048; B60N 3/04; B60N 3/046; F16B 5/12; F16B 21/04; F16L 3/08
USPC .......................... 248/71, 68.1, 73, 74.1, 74.2
See application file for complete search history.

(56) References Cited

U.S. PATENT DOCUMENTS

| | | | | |
|---|---|---|---|---|
| 4,918,261 | A * | 4/1990 | Takahashi | F16L 3/08 174/135 |
| 5,956,821 | A | 9/1999 | Kurek, III et al. | |
| 6,302,471 | B1 * | 10/2001 | Windpassinger | B60J 7/1226 296/107.01 |
| 7,232,952 | B2 * | 6/2007 | Lin | G02F 1/133608 174/72 A |
| 8,096,697 | B2 * | 1/2012 | Cheng | G02B 6/0083 362/630 |
| 8,485,479 | B2 * | 7/2013 | Chiu | H02G 3/32 248/73 |
| 8,561,950 | B2 * | 10/2013 | Li | H02G 3/32 248/74.1 |
| 8,708,288 | B2 * | 4/2014 | Oosawa | H05K 7/1447 248/68.1 |
| 8,844,882 | B2 * | 9/2014 | Cook | H02G 3/30 248/74.2 |
| 9,083,169 | B2 * | 7/2015 | James | F16B 37/045 |
| 9,254,908 | B2 * | 2/2016 | Healy | H02G 3/32 |
| 9,539,959 | B2 * | 1/2017 | Matsumura | B60R 16/0215 |
| 9,676,297 | B2 * | 6/2017 | Peniche | B60N 2/0725 |
| 9,748,756 | B2 * | 8/2017 | Cho | H02G 15/117 |
| 10,486,619 | B2 * | 11/2019 | Li | B60R 13/0206 |
| 10,711,813 | B2 * | 7/2020 | Santillan Gutierrez | F16B 5/126 |
| 10,761,285 | B2 * | 9/2020 | Courchaine | H02G 3/34 |
| 10,907,674 | B1 * | 2/2021 | Engelbreth | A61M 16/208 |
| 2006/0246745 | A1 * | 11/2006 | Kao | H02G 3/22 439/60 |
| 2008/0105796 | A1 * | 5/2008 | Nix | F16L 3/222 248/73 |
| 2008/0198601 | A1 * | 8/2008 | Cheng | G02B 6/0083 362/253 |
| 2015/0259013 | A1 * | 9/2015 | Dixon | F16B 5/121 280/154 |
| 2016/0197435 | A1 | 7/2016 | Kitamura et al. | |
| 2020/0011357 | A1 * | 1/2020 | Fukami | B60R 16/0215 |

FOREIGN PATENT DOCUMENTS

| | | |
|---|---|---|
| JP | 57-157896 | 9/1982 |
| JP | 59-63614 | 4/1984 |
| JP | 62-290304 | 12/1987 |
| JP | 63-166635 | 7/1988 |
| JP | 11-115628 | 4/1999 |
| JP | 2001-232678 | 8/2001 |
| JP | 2005-080434 | 3/2005 |
| JP | 2007-174860 | 7/2007 |
| JP | 2010-37704 | 2/2010 |
| JP | 2012-214201 | 11/2012 |
| JP | 2016-200225 | 12/2016 |
| JP | 2018-050390 | 3/2018 |
| KR | 10-0767824 | 10/2007 |

OTHER PUBLICATIONS

International Search Report (ISR) issued in International Patent Application No. PCT/JP2018/039257, dated Dec. 25, 2018, together with English translation thereof.
International Preliminary Report on Patentability (IPRP) issued in International Patent Application No. PCT/JP2018/039257, dated Nov. 26, 2020, together with English transltaion thereof.
China Office Action issued in China Patent Application No. 201880093443.6, dated Jul. 30, 2021, together with English translation thereof.
Japan Office Action issued in Japan Patent Application No. 2020-028114, dated Jun. 7, 2022, together with English translation thereof.

* cited by examiner

FIXING STRUCTURE OF WIRING MEMBER

TECHNICAL FIELD

The present invention relates to a technique of fixing a wiring member.

BACKGROUND ART

Patent Document 1 discloses a technique of embedding and fixing a wire harness as a wiring member to a urethane member (also referred to as a silencer, for example) disposed between a body and a floor mat in a bottom part of an automobile for purpose of acoustic insulation and flattening a concavo-convex shape, for example.

PRIOR ART DOCUMENTS

Patent Documents

Patent Document 1: Japanese Patent Application Laid-Open No. 63466635

SUMMARY

Problem to be Solved by the Invention

However, in the technique described in Patent Document 1, the wire harness needs to be insert-molded as an insert component.

Accordingly, an object of the present invention is to provide a technique capable of easily fixing a wiring member to a silencer formed separately from the wiring member.

Means to Solve the Problem

In order to solve the above problem, a fixing structure of a wiring member according to a first aspect includes: a silencer formed of a material having sound insulating properties, including an inserted part with one surface as an insertion surface crossing a main surface, and disposed on a vehicle; a wiring member disposed along the main surface of the silencer; and a fixing member including an insertion part inserted into the inserted part from the insertion surface and an insertion state maintaining part maintaining a state where the insertion part is inserted into the inserted part, and attached to the wiring member.

A fixing structure of a wiring member according to a second aspect is the fixing structure of the wiring member according to the first aspect, wherein a tip end of the insertion part is funned into a tapered shape so as to be able to form a hole in the inserted part, where no hole has been formed, to be inserted into the inserted part.

A fixing structure of a wiring member according to a third aspect is the fixing structure of the wiring member according to the first or second aspect, wherein the inserted part includes an outer surface provided on a side opposite to the insertion surface, and the insertion state maintaining part includes an inner wing part protruding toward the outer surface from a part of the insertion part passing through the inserted part to extend to an outer side of the outer surface.

A fixing structure of a wiring member according to a fourth aspect is the fixing structure of the wiring member according to any one of the first to third aspects, wherein the inserted part includes an outer surface provided on a side opposite to the insertion surface, the fixing member further includes an extension part connected to a base end of the insertion part and extending to an outer side of the inserted part, and the insertion state maintaining part includes an outer wing part protruding from a side of the tip end of the extension part extending over the outer surface toward the outer surface.

A fixing structure of a wiring member according to a fifth aspect is the fixing structure of the wiring member according to any one of the first to fourth aspects, wherein the fixing member further includes an extension part connected to a base end of the insertion part and extending to an outer side of the inserted part, and the insertion state maintaining part includes a sandwiching part made up of the insertion part and the extension part to sandwich the inserted part.

A fixing structure of a wiring member according to a sixth aspect is the fixing structure of the wiring member according to any one of the first to fifth aspects, wherein the inserted part includes an outer surface provided on a side opposite to the insertion surface, and the insertion state maintaining part includes a wide part in which a part of the insertion part passing through the inserted part to extend to an outer side of the outer surface is formed wider than a part of the insertion part housed in an inner side of the inserted part.

A fixing structure of a wiring member according to a seventh aspect is the fixing structure of the wiring member according to any one of the first to sixth aspects, wherein the inserted part is formed to protrude outward from the main surface.

A fixing structure of a wiring member according to an eighth aspect is the fixing structure of the wiring member according to any one of the first to seventh aspects, wherein the wiring member includes a wiring body which is flatly formed, and the fixing member is joined to the wiring body.

A fixing structure of a wiring member according to a ninth aspect is the fixing structure of the wiring member according to any one of the first to eighth aspects, wherein the wiring member includes a plurality of wire-like transmission members, the fixing member further includes a fixing part formed to be connected to the insertion part, and the fixing part and the plurality of wire-like transmission members are bound by a banding member.

A fixing structure of the wiring member according to a tenth aspect is the fixing structure of the wiring member according to any one of first to ninth aspects, wherein the silencer is integrally molded into a shape including a body part having the main surface and the inserted part.

A fixing structure of the wiring member according to an eleventh aspect is the fixing structure of the wiring member according to any one of first to tenth aspects, wherein the inserted part includes an outer surface provided on a side opposite to the insertion surface, and the insertion state maintaining part includes a part caught on the outer surface when force in a direction of being pulled from the inserted part is applied to the insertion part in a state where the insertion part is inserted from the insertion surface in the inserted part.

Effects of the Invention

According to each aspect, the fixing member is inserted into the insertion surface of the silencer and the fixing member is attached to the wiring member, thus the wiring member can be fixed to the silencer via the fixing member. Accordingly, the wiring member can be easily fixed to the silencer formed separately from the wiring member.

According to the second aspect, the hole needs not be formed in the silencer in advance. Accordingly, processing of the silencer can be easily performed. A reduction in sound insulating properties of the silencer can be suppressed.

According to the third aspect, when force in a direction of being pulled from the inserted part is applied to the insertion part, the inner wing part is caught on the outer surface, thus the insertion part hardly comes out of the inserted part.

According to the fourth aspect, when force in a direction of being pulled from the inserted part is applied to the insertion part, the outer wing part is caught on the outer surface, thus the insertion part hardly comes out of the inserted part.

According to the fifth aspect, the sandwiching part sandwiches the inserted part, thus friction force between the silencer and the fixing member increases. Thus, even when force in the direction of being pulled from the inserted part is applied to the insertion part, the insertion part hardly comes out of the inserted part. The sandwiching part sandwiches the inserted part, thus a backlash between the fixing member and the silencer hardly occurs.

According to the sixth aspect, when force in a direction of being pulled from the inserted part is applied to the insertion part, the wide part is caught on the outer surface, thus the insertion part hardly comes out of the inserted part.

According to the seventh aspect, the formation of the hole passing through the silencer in the thickness direction in the part of the inserted part and a reduction in thickness therein can be suppressed.

According to the eighth aspect, the wiring body and the fixing member are joined, thus the fixing member can be attached to the wiring member.

According to the ninth aspect, the fixing member can be attached to the wiring member by the banding member.

DESCRIPTION OF EMBODIMENT(S)

Embodiment

Figure 1:
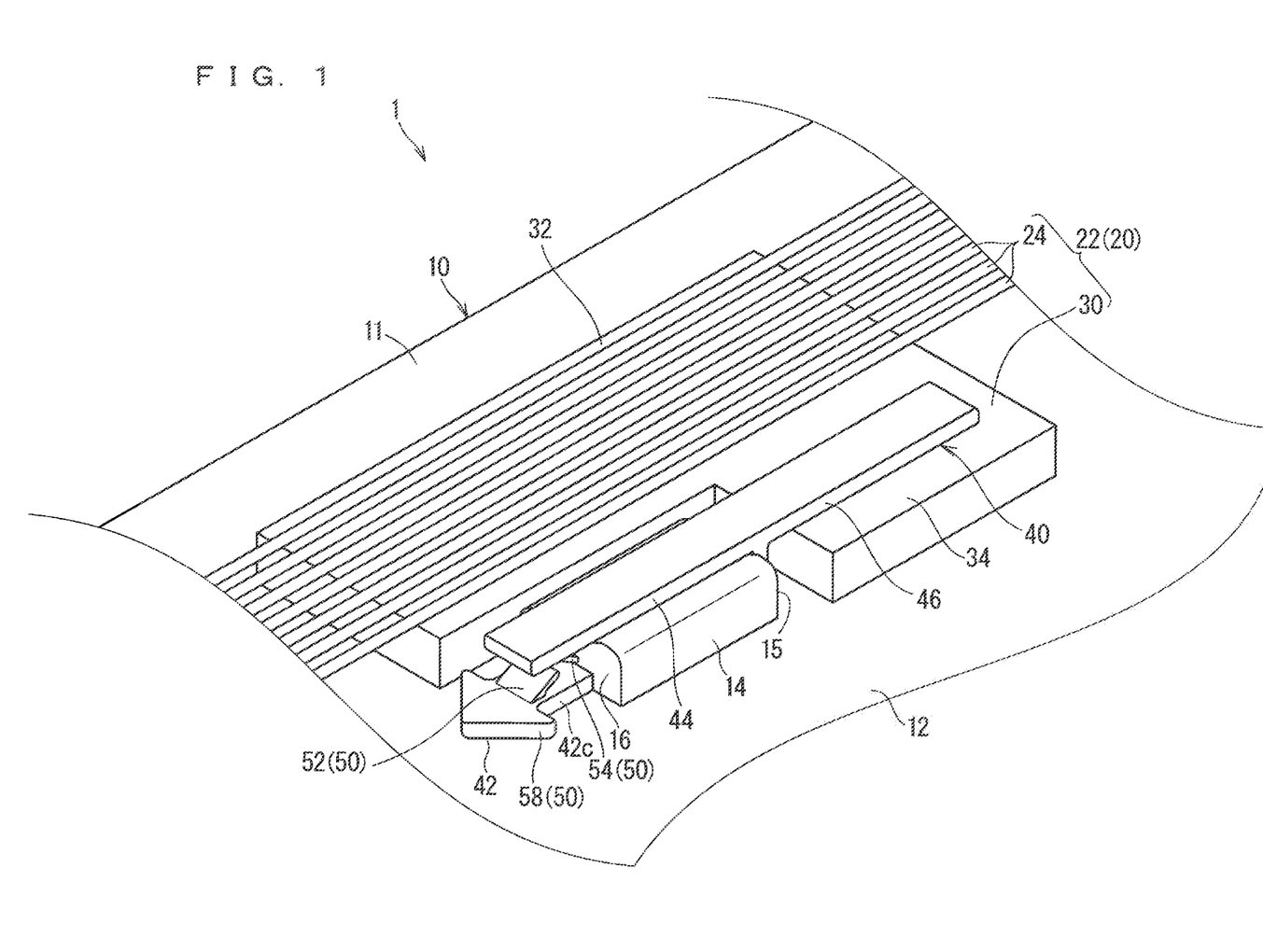
FIG. 1 is a perspective view illustrating a fixing structure of a wiring member according to an embodiment.
Figure 2:
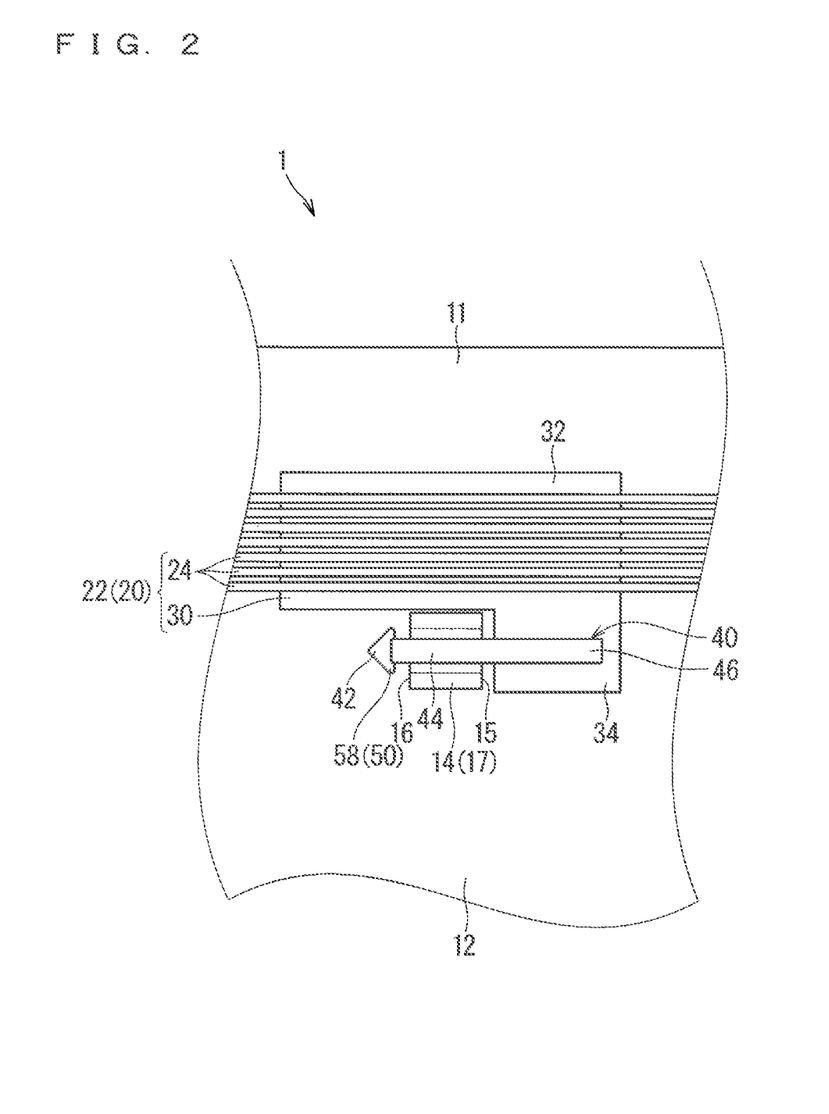
FIG. 2 is a plan view illustrating the fixing structure of the wiring member according to the embodiment.
Figure 3:
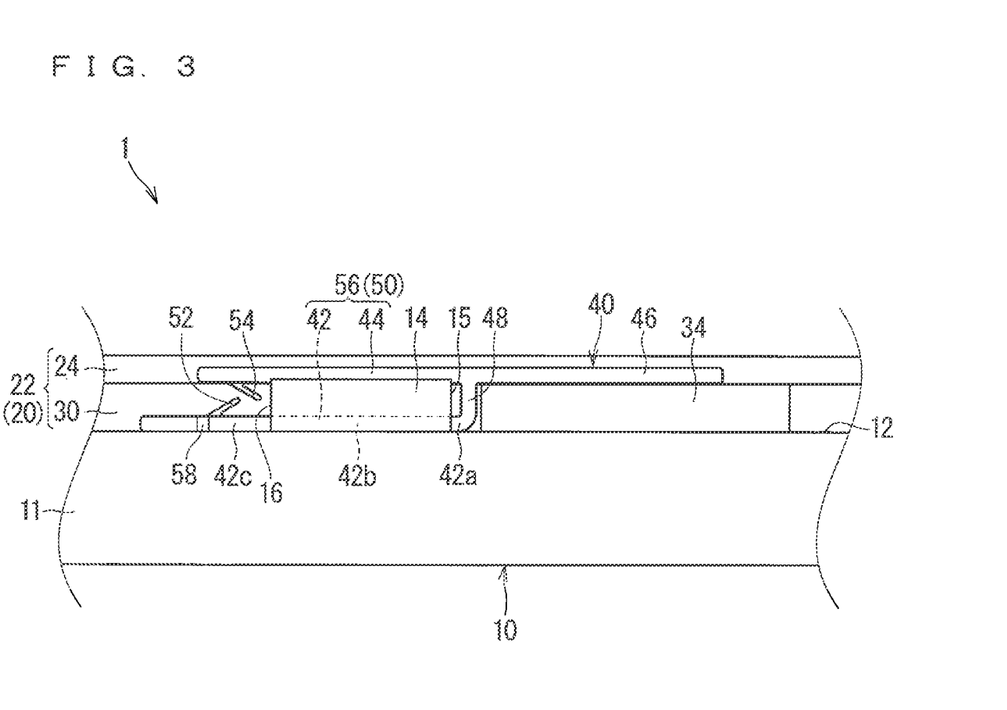
FIG. 3 is a side view illustrating the fixing structure of the wiring member according to the embodiment.

A fixing structure of a wiring member according to an embodiment is described hereinafter. FIG. 1 is a perspective view illustrating a fixing structure 1 of a wiring member according to the embodiment. FIG. 2 is a plan view illustrating the fixing structure 1 of the wiring member according to the embodiment. FIG. 3 is a side view illustrating the fixing structure 1 of the wiring member according to the embodiment.

The fixing structure 1 of the wiring member includes silencer 10, a wiring member 20, and a fixing member 40. In the fixing structure 1 of the wiring member, the wiring member 20 is fixed to the silencer 10 by the fixing member 40.

The silencer 10 is a member disposed in a vehicle for a purpose of acoustic insulation, for example. In the description hereinafter, the silencer 10 is a floor silencer disposed between a floor mat and a body in a vehicle, for example. Specifically, the silencer 10 includes a body part 11 and an inserted part 14.

The body part 11 includes a main surface 12. The inserted part 14 is formed in a part of the body part 11. The inserted part 14 includes an insertion surface 15 crossing a main surface 12 and an outer surface 16 provided on a side opposite to the insertion surface 15. Herein, the inserted part 14 is formed as a protrusion part 17 protruding outward from the main surface 12, The protrusion part 17 is formed into a rectangular parallelepiped shape, for example. A pair of side surfaces of the rectangular parallelepiped protrusion part 17 each facing a side opposite to each other are defined as the insertion surface 15 and the outer surface 16.

The silencer 10 is formed into a plate-like shape by a material having acoustic insulation properties. In the description herein, the silencer 10 is formed by mixing a chip of a resin foam such as foamed polyurethane with an adhesive agent (binder) applied to the chip and then compressing and integrally fixing them under vapor atmosphere. A known adhesive agent, such as a urethane chip adhesive agent, according to a material of the chip can be applied as the adhesive agent.

A method of manufacturing the silencer 10 is not limited thereto described above. For example, the silencer 10 may be formed by foaming a resin material such as polyurethane and performing mold forming on the resin material, or also may be formed of a material of a non-woven fabric. For example, a silencer 10 may be formed of numberless compressed fibrous members. In this case, the numberless fibrous members may be entangled with and bonded to each other, or may also be fixed by an adhesive agent, for example. The fibrous members may be made up of natural fiber or chemical fiber.

In the example illustrated in FIG. 3, the body part 11 of the silencer 10 is flatly formed, but may have a portion with concave and convex in a thickness direction for purpose of following a shape of the body or partially adding a volume of the silencer 10.

The wiring member 20 is a member joined to a component mounted to the vehicle to transmit electrical power or light to and/or from the component. The wiring member 20 is disposed along the main surface 12 of the silencer 10. The wiring member 20 includes a wiring body which is flatly formed. In the description hereinafter, the wiring body is a sheet material-attached wiring body 22. The sheet material-attached wiring body 22 includes a plurality of wire-like transmission members 24 and a sheet material 30.

The wire-like transmission member 24 needs to be a wire-like member transmitting electrical power or light, for example. For example, the wire-like transmission member 24 may be a general wire 24 having a core wire and a covering around the core wire, or may also be a core conductive wire, a shielded wire, an enamel wire, a nichrome wire, or an optical fiber. The wire-like transmission member 24 transmitting the electrical power may be various kinds of signal lines or various kinds of power lines.

Herein, the wire-like transmission member 24 includes a transmission line body transmitting electrical power or light and a jacket covering the transmission line body. In the description hereinafter, the wire-like transmission member 24 is a general wire 24 (simply referred to as the electrical wire 24 hereinafter). That is to say, the electrical wire 24 includes a core wire as the transmission line body and an insulating covering as the jacket covering the transmission line body.

The core wire is made up of one or a plurality of strands. The strand is formed of a conductor made of copper, copper alloy, aluminum, or aluminum alloy, for example. When the core wire is made up of the plurality of strands, the plurality of strands are preferably stranded. The insulating covering is formed of a resin material such as polyvinyl chloride (PVC) or polyethylene (PE) extrusion-molded around the core wire. Herein, the electrical wire 24 is a so-called round wire having a round shape in cross-section.

The plurality of electrical wires 14 are disposed on the main surface 12 of the sheet material 30. A route of the electrical wire 24 on the sheet material 30 may be appropriately set. In the example illustrated in FIG. 1, the electrical wire 24 is linearly disposed on the sheet material 30, but may be curved and disposed, or may be disposed to have both a linear part and a curved part. In the example illustrated in FIG. 1, the plurality of electrical wires 24 are parallelly disposed on a substrate, however, at least some of the plurality of electrical wires 24 may extends along a different route.

A connector, for example, is provided on an end portion of the electrical wire 24, and the connector is connected to a partner connector provided on a component to which the wiring member 20 is connected. For example, the connector is formed by housing the end portion of the electrical wire 24 in an electrical wire housing part of a housing. In the example illustrated in FIG. 1, the end portion of the electrical wire 24 extends to an outer side of the sheet material 30, however, the end portion of the electrical wire 24 may be located on the sheet material 30. In this case, the housing may be or may not be directly fixed to the sheet material 30.

The sheet material 30 keeps the plurality of electrical wires 24 in a flat state. Herein, the electrical wire 24 is disposed on the sheet material 30. The electrical wire 24 and the sheet material 30 are fixed by a fixing means. Welding is adopted herein as a means of fixing the electrical wire 24 and the sheet material 30, That is to say, at least one of the electrical wire 24 and the sheet material 30 has a resin material, and the resin material is melt to be joined to the other element.

The welding means is not particularly limited, however, adoptable are various welding means such as ultrasonic welding, heating and pressurizing welding, hot-air welding, and high-frequency welding.

A material constituting the sheet material 30 is not particularly limited. The material constituting the sheet material 30 may include resin such as PVC, PE, polyethylene terephthalate (PET), or polypropylene (PP), for example, or may include metal such as aluminum or copper. However, when the electrical wire 24 and the sheet material 30 are welded and fixed, it is preferable that the insulating covering of the electrical wire 24 and the sheet material 30 are formed of the same material or a material appropriate for welding.

The sheet material 30 may be made of a material having fiber such as a woven cloth, a knitted cloth, or a non-woven cloth, for example, or may not have fiber but be bonded and formed by extrusion molding or injection molding. In the latter case, the sheet material 30 may be a foam formed by foam molding, or may be molded to have a solid cross section instead of the foam molding.

The sheet material 30 may have a single layer structure or a multilayer structure. When the sheet material 30 has the multilayer structure, it is considered that a resin layer and a resin layer are stacked, for example. It is also considered that a resin layer and a metal layer are stacked, for example. It is also considered that a metal layer and a metal layer are stacked, for example. When the sheet material 30 is made by stacking the resin layer and the resin layer, layers with fiber or layers with no fiber may be overlapped with each other, or a layer with fiber and a layer with no fiber may be overlapped with each other.

When the sheet material 30 has the multilayer structure, the sheet material 30 may be molded by bonding sheet-like members which have been separately molded, or may be molded by single extrusion molding or injection molding.

Figure 4:
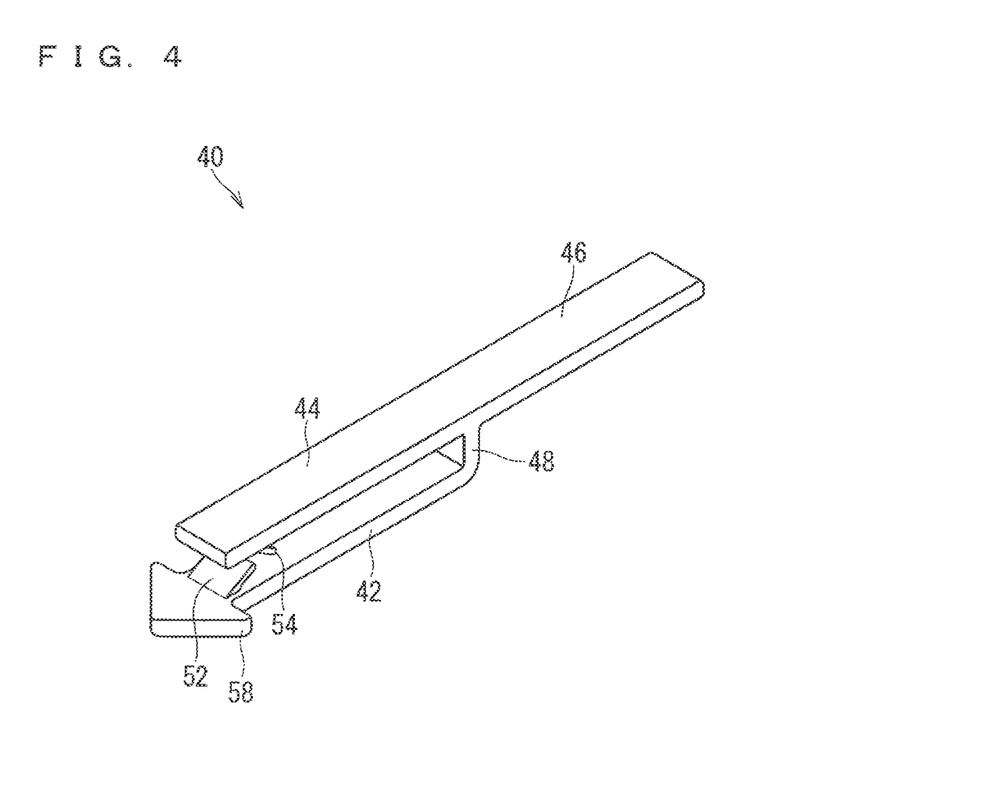
FIG. 4 is a perspective view illustrating a fixing member.
Figure 5:
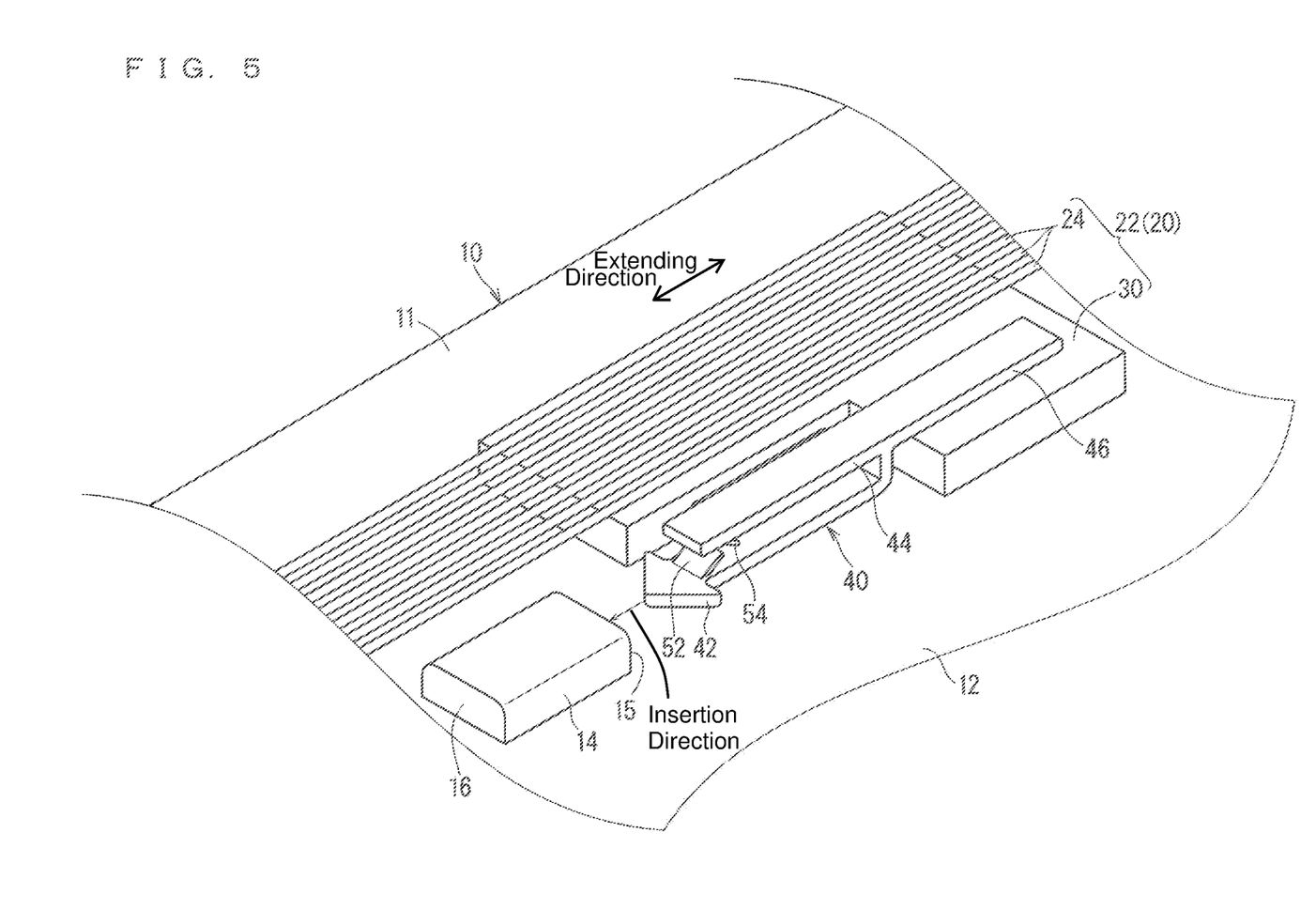
FIG. 5 is an explanation diagram illustrating a state where a fixing member is fixed to a silencer.

The fixing member 40 is described with reference to FIG. 4 and FIG. 5 in addition to FIG. 1 to FIG. 3. FIG. 4 is a perspective view illustrating a fixing member 40. FIG. 4 is a perspective view illustrating a fixing member 40. FIG. 5 is an explanation diagram illustrating a state where the fixing member 40 is fixed to the silencer 10.

The fixing member 40 is a member for fixing the wiring member 20 to the silencer 10. The fixing member 40 is inserted into the silencer 10, thereby being fixed to the silencer 10. The fixing member 40 is attached to the wiring member 20. Accordingly, the fixing member 40 fixes the wiring member 20 to the silencer 10. Specifically, the fixing member 40 includes an insertion part 42. Herein, the fixing member 40 further includes an extension part 44, a fixing part 46, and a connection part 48.

In the example illustrated in FIG. 4, the insertion part 42 is formed into one plate-like shape. The extension part 44 and the fixing part 46 are connected to be formed into one plate-like shape with a length larger than the insertion part 42. The connection part 48 having a plate-like shape with a length smaller than the insertion part 42 connects one end portion of the insertion part 42 and a portion between the extension part 44 and the fixing part 46.

From the other viewpoint, the fixing member 40 is formed into a shape including first, second, and third plate-like parts. An end portion of the first plate-like part and an intermediate portion of the second plate-like part are connected by the third plate-like part. The second plate-like part is formed to have a length larger than the first plate-like part. The third plate-like part is formed to have a length smaller than the first plate-like part. The first plate-like part and the second plate-like part are parallel to each other. The third plate-like part is orthogonal to the first plate-like part and the second plate-like part.

In the fixing member 40 formed into such a shape, the first plate-like part is defined as the insertion part 42. A part of the second plate-like part on one end side (a side of the first plate-like part) in relation to a part connected to the third plate-like part is defined as the extension part 44. A part of the second plate-like part on the other end side in relation to the part connected to the third plate-like part is defined as the fixing part 46. The third plate-like part is defined as the connection part 48.

The insertion part 42 is inserted into the inserted part 14 from the insertion surface 15. Herein, the insertion part 42 passes through the inserted part 14. That is to say, a dimension of the insertion part 42 along a longitudinal direction is larger than that of the inserted part 14 between the insertion surface 15 and the outer surface 16.

A direction in which the insertion part 42 is inserted into the inserted part 14 is referred to as an insertion direction hereinafter. The insertion direction of the insertion part 42 is a direction crossing the insertion surface 15. When the inserted part 14 has the outer surface 16, the insertion direction is a direction connecting the insertion surface 15 and the outer surface 16.

The insertion direction may include only a horizontal component, only a vertical component, or both the horizontal component and the vertical component in a state where the fixing structure 1 of the wiring member is disposed in a vehicle. When the insertion direction includes the horizontal component, a direction of the horizontal component may be a direction corresponding to a front-back direction of the vehicle, a direction corresponding to a right-left direction of the vehicle, or a direction corresponding to a direction crossing the front-back direction and the right-left direction of the vehicle.

In the description hereinafter, a part of the insertion part 42 extending to an outer side from the insertion surface 15 is a first part 42a. A part of the insertion part 42 located inside the inserted part 14 is a second part 42b. A part of the insertion part 42 extending to an outer side from the outer surface 16 is a third part 42c. The first part 42a is a part connected to the connection part 48 and corresponding to a base end portion of the insertion part 42. The second part 42b is a part connecting the first part 42a and the third part 42c. The third part 42c is a part constituting a free end and corresponding to a tip end portion of the insertion part 42.

A tip end of the insertion part 42 (a tip end of the third part 42c herein) is formed into a tapered shape so as to be able to form a hole in the inserted part 14, where no hole has been formed, to be inserted into the inserted part 14.

The extension part 44 parallelly faces the insertion part 42 in a state where the insertion part 42 is inserted into the inserted part 14. The extension part 44 extends to outer side of the inserted part 14 in the state where the insertion part 42 is inserted into the inserted part 14, The tip end of the extension part 44 extend over the inserted part 14 in the state where the insertion part 42 is inserted into the inserted part 14. That is to say, a dimension of the extension part 44 along a longitudinal direction is larger than that of the inserted part 14 between the insertion surface 15 and the outer surface 16. In the example illustrated in FIG. 4, the dimension of the extension part 44 along the longitudinal direction is smaller than that of the insertion part 42 along the longitudinal direction, but may be equal to each other, or the extension part 44 may have a larger length.

The fixing part 46 is used to attach the fixing member 40 to the wiring member 20. Herein, the fixing part 46 is joined to the sheet material 30 of the sheet material-attached wiring body 22, thus the fixing member 40 is attached to the sheet material-attached wiring body 22. That is to say, the fixing member 40 is joined to the wiring body herein.

More specifically, the sheet material 30 has a fixing piece 34 extending to a lateral side of a wire disposed part 32 where the electrical wire 24 is disposed. The fixing part 46 is joined to the fixing piece 34. At this time, a surface of the sheet material 30 where the electrical wire 24 is disposed is joined to the fixing part 46. A surface of the fixing part 46 on a side of the silencer 10 is joined to the sheet material 30.

A method of joining the fixing member 40 and the sheet material 30 is not particularly limited, however, various joining methods can be adopted. For example, the fixing part 46 and the fixing piece 34 may be welded, or may be joined by an adhesive agent or an adhesive tape. For example, the fixing part 46 and the fixing piece 34 may be joined by a locking structure in which a locking part formed in the fixing part 46 is locked to a locked part formed in the fixing piece 34. For example, the fixing part 46 and the fixing piece 34 may be joined by a screw, a pin, or a rivet.

However, a joining position in each of the sheet material 30 and the fixing member 40 is not limited to that described above. For example, in the sheet material 30, the wire disposed part 32 may be joined to the fixing member 40. A surface of the sheet material 30 on a side opposite to a surface where the electrical wire 24 is disposed may be joined to the fixing part 46. In this case, the electrical wire 24 is located on the side of the silencer 10 in relation to the sheet material 30. For example, in the fixing member 40, the extension part 44 may be joined to the sheet material 30.

Also in the case where the fixing part 46 is joined to the sheet material 30, a joining configuration thereof is not limited to that described above. For example, a surface of the fixing part 46 on a side opposite to a surface on the side of the silencer 10 may be joined to the sheet material 30. For example, the fixing part 46 may be formed in a position extending into the same plane as the insertion part 42 in place of the fixing part 46 in a current position. The fixing member in this case has a shape in which positions of the insertion part 42 and the extension part 44 are switched in the fixing member 40. For example, the fixing part 46 may also be formed in the position extending into the same plane as the insertion part 42 in addition to the fixing part 46 in the current position. The fixing member in this case has a shape in which a plate-like part constituting the insertion part 42 in the fixing member 40 extends ahead of the connection part 48, and has an H-shape in a side view. In this case, it is also considered that the wiring body is sandwiched by the two fixing parts 46. For example, it is also applicable that the sheet material-attached wiring body 22 includes the two sheet materials 30 sandwiching the electrical wire 24 and the fixing part 46 is sandwiched between the two sheet materials 30.

The fixing member 40 includes an insertion state maintaining part 50. The insertion state maintaining part 50 maintains a state where the insertion part 42 is inserted into the inserted part 14. Herein, the insertion state maintaining part 50 includes an inner wing part 52, an outer wing part 54, a sandwiching part 56, and a wide part 58.

The inner wing part 52 is formed to protrude from the third part 42c of the insertion part 42 toward the outer surface 16. That is to say, the inner wing part 52 protrudes from a surface on a side of the extension part 44 in the third part 42c of the insertion part 42, and is formed away from the insertion part 42 toward the second part 42b. A tip end portion of the inner wing part 52 is away from the insertion part 42. The inner wing part 52 can be elastically deformed so that the tip end portion thereof gets close to the insertion part 42. Particularly, when the insertion part 42 is inserted into the inserted part 14, the inner wing part 52 has direct contact with the inserted part 14, and can be elastically deformed so that the tip end portion thereof gets close to the insertion part 42. At this time, the inner wing part 52 passes through an inner side of the inserted part 14 together with the third part 42c.

The outer wing part 54 protrudes from a side of the tip end of the extension part 44 extending over the outer surface 16 toward the outer surface 16. That is to say, the outer wing part 54 protrudes from a surface on a side of the insertion part 42 in the tip end of the extension part 44, and is formed away from the extension part 44 toward the base end of the extension part 44. A tip end portion of the outer wing part 54 is away from the extension part 44. The outer wing part 54 can be elastically deformed so that the tip end portion thereof gets close to the extension part 44. Particularly, when the insertion part 42 is inserted into the inserted part 14, the outer wing part 54 has direct contact with the inserted part 14, and can be elastically deformed so that the tip end portion thereof gets close to the extension part 44. At this time, the outer wing part 54 passes through an outer side of the inserted part 14 together with the tip end portion of the extension part 44, and moves to a side of the outer surface 16 over the inserted part 14.

In the example illustrated in FIG. 4, the outer wing part 54 is formed be located on a side of the outer surface 16 in relation to the inner wing part 52, however, this configuration not necessary. The inner wing part 52 may be formed to be located on the side of the outer surface 16 in relation to the outer wing part 54, or both wing parts may be formed in the same position.

The sandwiching part 56 is a part sandwiching the inserted part 14. The sandwiching part 56 is made up of the insertion part 42 and the extension part 44. More specifically, the insertion part 42 and the extension part 44 are parallel to each other herein. A dimension of the connection part 48 along a direction connecting the insertion part 42 and the extension part 44 is smaller than a height dimension of the insertion surface 15. Accordingly, the insertion part 42 and the extension part 44 sandwich and hold the inserted part 14 to form the sandwiching part 56.

The wide part 58 is formed in the third part 42c of the insertion part 42. The wide part 58 is formed wider than the second part 42b of the insertion part 42. Herein, a tapered shape is formed from the wide part 58 toward the tip end of the insertion part 42. The wide part 58 is larger than the hole of the inserted part 14 into which the insertion part 42 is inserted, thus can be caught on the inserted part 14.

For example, when the hole is not formed in the inserted part 14 in advance, the inserted part 14 is considered to be formed softer than the insertion part 42. In this case, when the insertion part 42 is inserted, the hole is formed in the inserted part 14 by the tapered shape of the tip end of the insertion part 42. When the hole is formed, it is considered that a peripheral part of the hole is elastically deformed, thus the hole is widened. That is to say, when the insertion part 42 is inserted, it is considered that the hole smaller than the wide part 58 is formed in the inserted part 14, and the peripheral part of the hole is elastically deformed, thus the hole is widened so that the wide part 58 can pass therethrough. After the wide part 58 passes through the hole, the peripheral part of the hole is elastically restored, and the hole gets smaller than the wide part 58, thus the wide part 58 can be caught on the outer surface 16.

In the example illustrated in FIG. 4, the tip end of the inner wing part 52 is formed be located on the side of the outer surface 16 in relation to the wide part 58, however, this configuration is not necessary. The wide part 58 may be formed to be located on the side of the outer surface 16 in relation to the tip end of the inner wing part 52, or both wing parts may be formed in the same position.

The fixing member 40 is considered an integrated molded component of metal or resin as a material formed by injection molding using molds, for example. When the fixing member 40 of resin as a material is molded and the insertion part 42 is inserted into the inserted part 14 where no hole is formed in advance, it is sufficient that the insertion part 42 is formed harder than the inserted part 14.

In applying the fixing structure 1 of the wiring member to the vehicle, it is considered that a step (a) of attaching the fixing member 40 to the wiring member 20, a step (b) of inserting the fixing member 40 to the silencer 10, a step (c) of routing the wiring member 20 on the silencer 10, and a step (d) of assembling the silencer 10 to a vehicle are performed. The step (a) to the step (c) are steps of manufacturing the fixing structure 1 of the wiring member.

A procedure of the step (a) to the step (d) is not particularly limited, however, it is sufficient that the step (a) to the step (d) are performed n an optional order. However, it is preferable that the step (d) is performed after the step a) to the step (c) are performed. That is to say, it is preferable that in a state where the wiring member 20 is fixed to the silencer 10 by the fixing member 40 to integrally constitute the fixing structure 1 (silencer module) of the wiring member, the silencer module is assembled to the vehicle. Accordingly, a process of assembling the silencer 10 and the wiring member 20 to the vehicle can be simplified.

According to the fixing structure 1 of the wiring member having the above configuration, the fixing member 40 is inserted into the inserted part 14 of the silencer 10 and the fixing member 40 is attached to the wiring member 20, thus the wiring member 20 can be fixed to the silencer 10 via the fixing member 40. Accordingly, the wiring member 20 can be easily fixed to the silencer 10 formed separately from the wiring member 20.

The tip end of the insertion part 42 is formed into the tapered shape, thus the hole needs not be formed in the silencer 10 in advance. Accordingly, processing of the silencer 10 can be easily performed. A reduction in sound insulating properties of the silencer 10 can be suppressed.

The insertion state maintaining part 50 includes the inner wing part 52, thus when force in a direction of being pulled from the inserted part 14 is applied to the insertion part 42, the inner wing part 52 is caught on the outer surface 16, thus the insertion part 42 hardly comes out of the inserted part 14.

The insertion state maintaining part 50 includes the outer wing part 54, thus when force in a direction of being pulled from the inserted part 14 is applied to the insertion part 42, the outer wing part 54 is caught on the outer surface 16, thus the insertion part 42 hardly comes out of the inserted part 14.

The sandwiching part 56 sandwiches the inserted part 14, thus friction force between the silencer 10 and the fixing member 40 increases. Thus, even when force in the direction of being pulled from the inserted part 14 is applied to the insertion part 42, the insertion part 42 hardly comes out of the inserted part 14. The sandwiching part 56 sandwiches the inserted part 14, thus a backlash between the fixing member 40 and the silencer 10 hardly occurs.

The insertion state maintaining part 50 includes the wide part 58, thus when force in the direction of being pulled from the inserted part 14 is applied to the insertion part 42, the wide part 58 is caught on the outer surface 16, thus the insertion part 42 hardly comes out of the inserted part 14.

The inserted part 14 is formed to protrude outward from the main surface 12, thus a formation of a hole passing through the silencer 10 in the thickness direction in the part of the inserted part 14 and a reduction in thickness therein can be suppressed.

The wiring body and the fixing member 40 are joined, thus the fixing member 40 can be attached to the wiring member 20.

The silencer module is assembled to the vehicle in a state where the fixing structure 1 of the wiring member is formed to constitute the silencer module before being assembled to the vehicle, thus the silencer 10 and the wiring member 20 can be assembled to the vehicle easily.

MODIFICATION EXAMPLE

Figure 6:
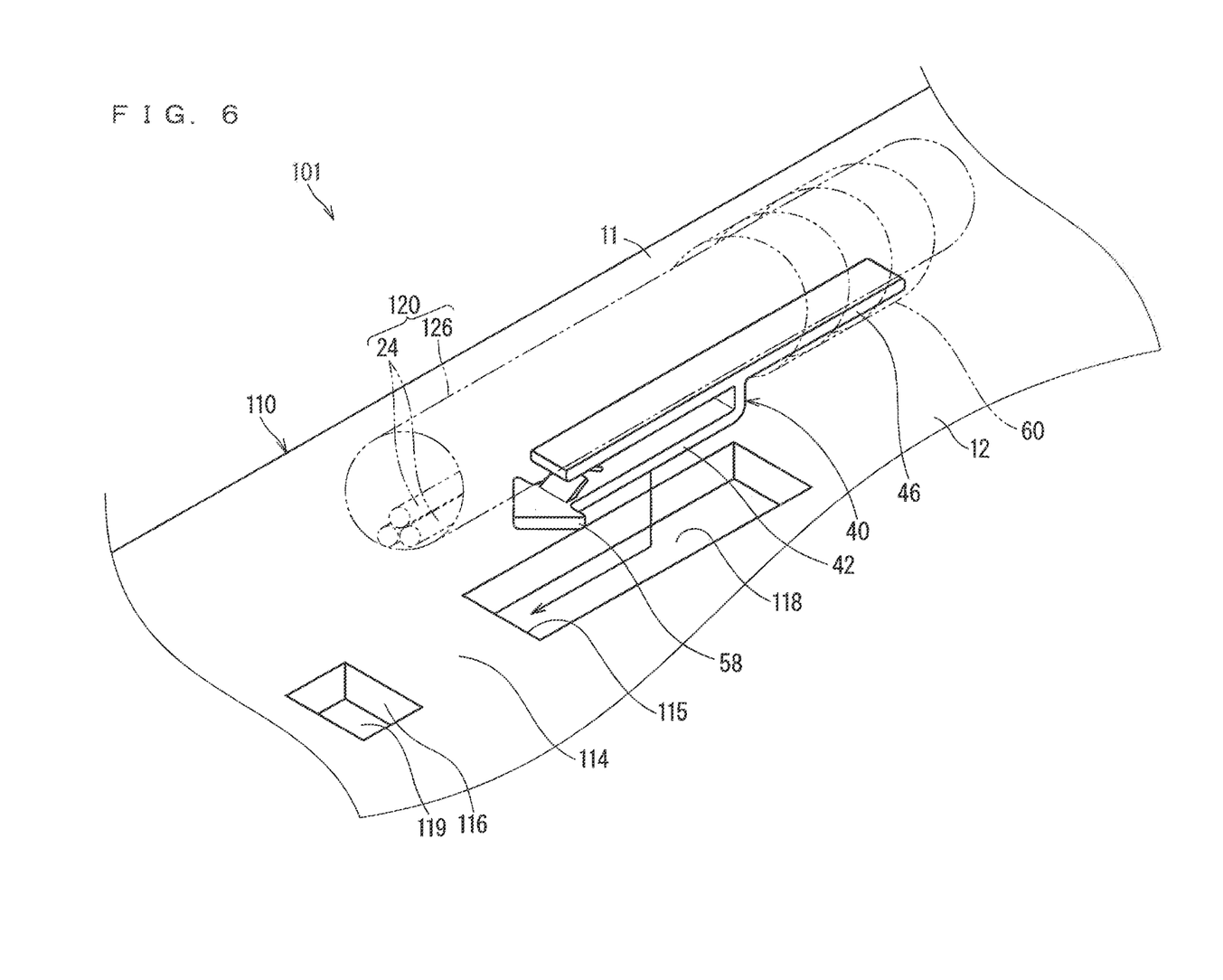
FIG. 6 is a perspective view illustrating a modification example of the fixing structure of the wiring member.

FIG. 6 is a partial exploded perspective view illustrating a modification example of the fixing structure 1 of the wiring member.

In a fixing structure 101 of a wiring member according to a modification example, a shape of a wiring member 120 and a configuration of attaching the fixing member 40 to the wiring member 120 are different from the shape of the wiring member 20 in the fixing structure 1 of the wiring member described above and the configuration of attaching the fixing member 40 to the wiring member 20.

Specifically, with regard to the shape of the wiring member 120, a plurality of wire-like transmission members 24 are bundled by a banding member 126 to constitute the wiring member 120. Herein, the plurality of wire-like transmission members 24 are bundled into a round shape in cross-section to constitute the wiring member 120.

The type of the banding member 126 and the method of bundling the plurality of wire-like transmission members 24 are not particularly limited. For example, it is considered that an adhesive tape is helically wound around the plurality of wire-like transmission members 24 in a form of rough winding or double winding to bundle the plurality of wire-like transmission members 24. For example, it is considered that a protection sheet material is wound in a form of sushi roll or rafter to bundle the plurality of wire-like transmission members 24. For example, it is considered that the plurality of wire-like transmission members 24 are housed in a tubular member such as a corrugated tube and bundled. For example, it is considered that an adhesive tape or a banding band is wound around the plurality of wire-like transmission members 24 in a plurality of positions at intervals along a longitudinal direction of the wire-like transmission member 24 to bundle the plurality of wire-like transmission members 24.

With regard to the configuration of attaching the fixing member 40 to the wiring member 120, the fixing part 46 and the plurality of wire-like transmission members 24 are bound by a banding member 60. Thus, the fixing member 40 is attached to the wiring member 120.

The banding member 60 is not particularly limited. The banding member 60 may be provided separately from the fixing member 40, or may also be integrally formed with the fixing member 40. When the banding member 60 is a member provided separately from the fixing member 40, an adhesive tape or a banding band, for example, is considered to be adopted as the banding member 60. When the banding member 60 is integrally formed with the fixing member 40, it is considered that a banding band structure including a band part and a band fixing part as the banding member 60 is provided on the fixing part 46 of the fixing member 40, for example.

The banding member 60 may be wound to be overlapped with a position where a handing member 126 bundling the plurality of wire-like transmission members 24 is located, or may also be wound around a position where the banding member 126 bundling the plurality of wire-like transmission members 24 is not located.

In the fixing structure 101 of the wiring member according to the modification example, a shape of an inserted part 114 is different from the shape of the inserted part 14 in the fixing structure 1 of the wiring member described above.

Specifically, an insertion surface 115 of the inserted part 114 is formed to be concaved from the main surface 12. More specifically, a concave portion 118 is formed on the main surface 12 of the body part 11 of the silencer 110, and one of inner side surfaces of the concave portion 118 constitutes the insertion surface 115. A lateral part of the concave portion 118 of the body part 11 of the silencer 110 connected to the insertion surface 115 constitutes the inserted part 114.

The concave portion 118 is preferably formed to have a length equal to or larger than a plate-like part of the fixing member 40 including the insertion part 42. Accordingly, the insertion part 42 can be inserted into the inserted part 114 in a state where the plate-like part including the insertion part 42 is housed in the concave portion 118, thus an insertion operation can be easily performed. It is preferable that the concave portion 118 has a bottom and is not a through hole passing through the body part 11 of the silencer 110. That is to say, it is preferable that the insertion surface 115 is not an inner peripheral surface of the through hole. Accordingly, a reduction in sound insulating properties of the silencer 110 can be suppressed.

The insertion surface 15 according to the embodiment and the insertion surface 115 according to the modification example may be combined with each other. That is to say, the insertion surface may include both a part protruding to an outer side from the main surface 12 of the body part 11 such as the insertion surface 15 and a part concaved to an inner side in relation to the main surface 12 of the body part 11 such as the insertion surface 115.

Furthermore, in the example illustrated in FIG. 6, the other concave portion 119 is formed with an interval between the concave portions 119 and 118. The concave portion 118 is referred to as the first concave portion 118 and the concave portion 119 is referred to as the second concave portion 119 hereinafter.

The insertion part 42 is inserted into a part between the first concave portion 118 and the second concave portion 119. That is to say, in the example illustrated in FIG. 6, an inner side surface of the first concave portion 118 located on a side of the second concave portion 119 constitutes the insertion surface 115. An inner side surface of the second concave portion 119 located on a side of the first concave portion 118 constitutes an outer surface 116. The part between the first concave portion 118 and the second concave portion 119 constitutes the inserted part 114.

The second concave portion 119 is preferably formed to have a size so that the wide part 58 and the inner wing part 52 passing through the inserted part 114 and protruding outward are housed in the second concave portion 119. Accordingly, the wide part 58 and the inner wing part 52 can be easily caught on the outer surface 116.

According to the fixing structure 101 of the wiring member having the configuration described above, the bundle of the plurality of wire-like transmission members 24 can be used as the wiring member 120. At tins time, the fixing member 40 can be attached to the wiring member 120 by the banding member 60.

The inserted part 114 is formed by the concave portion 118, thus a protrusion dimension of the part protruding outward from the main surface 12 can be reduced to a low level.

Other Modification Example

In the above description, the flat wiring body is the sheet material-attached wiring body 22, however, this configuration is not necessary. The flat wiring body may be a so-called flexible flat cable (FFC) in which a plurality of core wires are collectively covered by one covering or a so-called flexible print substrate (FPC) in which a circuit is formed in conductive foil attached to an insulating film as a base, for example.

Also when the flat wiring body is the sheet material-attached wire 22, the configuration thereof is not limited to that described above. With regard to the shape of the wire-like transmission member 24, for example, an outer shape of the wire-like transmission member 24 may be formed into a rectangular shape in cross-section. In this case, an area of contact between the sheet material 30 and the wire-like transmission member 24 can be easily increased.

With regard to the means of fixing the wire-like transmission member 24 and the sheet material 30, for example, it is applicable that a resin of at least one of the wire-like transmission member 24 and the sheet material 30 is melted by heat or a solvent, thus the wire-like transmission member 24 and the sheet material 30 are joined. A known joining means such as melting and joining, fusion, and welding can be adopted as the joining means. The wire-like transmission member 24 and the sheet material 30 may be joined by an adhesive agent or an adhesive tape, for example. The wire-like transmission member 24 may be sewn to the sheet material 30 by a sewing thread, for example. The sheet material-attached wiring body 22 may include a cover covering the wire-like transmission member 24 from a side opposite to the sheet material 30 described above.

In the above description, the wire-like transmission member 24 extends in parallel to the insertion direction, however, this configuration is not necessary. The wire-like transmission member 24 may extend in a direction crossing the insertion direction. For example, when the wiring member 20 is the sheet material-attached wiring body 22, it is sufficient that the fixing member 40 is attached to the sheet material 30 in a direction different from that in the example illustrated in FIG. 1. For example, when the wiring member 20 is the bundle of the wire-like transmission members 24, it is sufficient that the fixing part 46 and the bundle of the wire-like transmission members 24 are bound by the banding member 60 using a fixing member in which the extension direction of the fixing part 46 is a direction crossing the insertion direction.

In the above description, the hole is not formed in the inserted part 14 in advance, however, this configuration is not necessary. The hole may be formed in the inserted part 14 in advance. In this case, there may also be a case where the tip end of the insertion part 42 is not formed into the tapered shape.

In the above description, the inner wing part 52, the outer wing part 54, the sandwiching part 56, and the wide part 58 are provided as the insertion state maintaining part 50, however, this configuration is not necessary. the insertion state maintaining part 50 other than the inner wing part 54, the outer wing part 56, the sandwiching part 58, and the wide part 50 may also be provided. One or some of the inner wing part 54, the outer wing part 56, the sandwiching part 56, and the wide part 58 may be omitted.

In the above description, one fixing member 40 is attached to one wiring member 20, however, this configuration is not necessary. The plurality of fixing members 40 may be attached to one wiring member 20. When the plurality of fixing members 40 are attached to one wiring member 20, the plurality of fixing members 40 may be attached so that the insertion directions thereof are all aligned in the same direction or a different direction is included. When the plurality of fixing members 40 are attached to one wiring member 20, all of the plurality of fixing members 40 may be inserted into the body part 11 of the same silencer 10, or some of the plurality of fixing members 40 may be inserted into the body part 11 of the different silencer 10 When the plurality of fixing members 40 are attached to one wiring member 20, it is also considered that one wiring member has a part formed as the sheet material-attached wiring body 22 and a part formed as the bundle of the wire-like transmission member 24, and the fixing members 40 are attached to these parts, respectively.

In the similar manner, in the above description, one fixing member 40 is inserted into the body part 11 of one silencer 10, however, this configuration is not necessary. The plurality of fixing members 40 may be inserted into the body part 11 of one silencer 10. When the plurality of fixing members 40 are inserted into the body part 11 of one silencer 10, the plurality of fixing members 40 may be inserted into one inserted part 14, or the plurality of fixing members 40 may be inserted into the different inserted parts 14, respectively. When the plurality of fixing members 40 are inserted into one silencer 10, the insertion directions thereof may be all aligned in the same direction or a different direction may also be included. When the plurality of fixing members 40 are inserted into one silencer 10, all of the plurality of fixing members 40 may be attached to the same wiring member 20, or some of the plurality of fixing members 400 may also be attached to the different wiring member 20.

Each configuration described in the embodiment and each modification example can be appropriately combined as long as they are not contradictory.

Although the present invention is described in detail, the foregoing description is in all aspects illustrative and does not restrict the invention. It is therefore understood that numerous modifications and variations can be devised without departing from the scope of the invention.

EXPLANATION OF REFERENCE SIGNS 1 fixing structure of wiring member
10 silencer
11 body part
12 main surface
14 inserted part
15 insertion surface
16 outer surface
20 wiring member
22 sheet material-attached wiring body
24 electrical wire (wire-like transmission member)
30 sheet material
40 fixing member
42 insertion part
46 fixing part
50 insertion state maintaining part
52 inner wing part
54 outer wing part
56 sandwiching part
58 wide part
60 banding member

The invention claimed is:
1. A fixing structure of a wiring member, comprising:
a silencer formed of a material having sound insulating properties, including an inserted part with an insertion surface crossing a main surface of the silencer, and disposed on a vehicle;
a wiring member disposed along the main surface of the silencer; and
a fixing member including an insertion part inserted into the inserted part from the insertion surface and an insertion state maintaining part maintaining a state where the insertion part is inserted into the inserted part, and attached to the wiring member,
wherein the wiring member includes an electrical wire, and an insertion direction in which the insertion part is inserted into the inserted part is an extending direction of the electrical wire in which the electrical wire extends,
the wiring member includes a wiring body which is flatly formed, and
the fixing member is joined to the wiring body.

2. The fixing structure of the wiring member according to claim 1, wherein
the inserted part includes an outer surface provided on a side opposite to the insertion surface,
the fixing member further includes an extension part connected to a base end of the insertion part and extending to an outer side of the inserted part, and
the insertion state maintaining part includes an outer wing part protruding from a side of a tip end of the extension part extending over the outer surface toward the outer surface.

3. The fixing structure of the wiring member according to claim 1, wherein
the fixing member further includes an extension part connected to a base end of the insertion part and extending along an outer side of the inserted part, and
the insertion part and the extension part of the fixing member sandwich and hold the inserted part.

4. The fixing structure of the wiring member according to claim 1, wherein
the inserted part includes an outer surface provided on a side opposite to the insertion surface, and
the insertion state maintaining part includes a wide part in which a part of the insertion part passing through the inserted part to extend to an outer side of the outer surface is formed wider than a part of the insertion part housed in an inner side of the inserted part.

5. The fixing structure of the wiring member according to claim 1, wherein
the inserted part is formed to protrude outward from the main surface.

6. The fixing structure of the wiring member according to claim 1, wherein
the wiring member includes a plurality of electrical wires,
the fixing member further includes a fixing part formed to be connected to the insertion part, and
the fixing part and the plurality of electrical wires are bound by a banding member.

7. The fixing structure of the wiring member according to claim 1, wherein
the silencer is integrally molded into a shape including a body part having the main surface and the inserted part.

8. The fixing structure of the wiring member according to claim 1, wherein
the inserted part includes an outer surface provided on a side opposite to the insertion surface, and
the insertion state maintaining part includes a part caught on the outer surface when force in a direction of being pulled from the inserted part is applied to the insertion part in a state where the insertion part is inserted from the insertion surface in the inserted part.

9. The fixing structure of the wiring member according to claim 1, wherein
the wiring member includes a sheet material including a flat main surface on which the electrical wire and the fixing member are provided such that the electrical wire and the fixing member do not overlap each other when viewed in a direction perpendicular to the flat main surface of the wiring member.

10. The fixing structure of the wiring member according to claim 9, wherein
the flat sheet material includes a wire disposed part on which the electrical wire is disposed and a fixing piece on which the fixing member is disposed,
the fixing piece extends to a direction orthogonal to the extending direction of the electrical wire, and is shorter than the wire disposed part in the extending direction,
the insertion part of the fixing member extends from an end of the fixing piece in the extending direction of the electrical wire.

11. A fixing structure of the wiring member, comprising:
a silencer formed of a material having sound insulating properties, including an inserted art with an insertion surface crossing a main surface of the silencer, and disposed on a vehicle;
a wiring member disposed along the main surface of the silencer; and
a fixing member including an insertion part inserted into the inserted part from the insertion surface and an insertion state maintaining part maintaining a state where the insertion part is inserted into the inserted part, and attached to the wiring member,
wherein the wiring member includes an electrical wire, and an insertion direction in which the insertion part is inserted into the inserted part is an extending direction of the electrical wire in which the electrical wire extends, and
a tip end of the insertion part is formed into a tapered shape so as to be able to form a hole in the inserted part, where no hole has been formed, to be inserted into the inserted part.

12. The fixing structure of the wiring member according to claim 11, wherein
the wiring member includes a wiring body which is flatly formed, and
the fixing member is joined to the wiring body.

13. A fixing structure of the wiring member, comprising:
a silencer formed of a material having sound insulating properties, including an inserted part with an insertion surface crossing a main surface of the silencer, and disposed on a vehicle;
a wiring member disposed along the main surface of the silencer; and
a fixing member including an insertion part inserted into the inserted part from the insertion surface and an insertion state maintaining part maintaining a state where the insertion part is inserted into the inserted part, and attached to the wiring member,
wherein the wiring member includes an electrical wire, and an insertion direction in which the insertion part is inserted into the inserted part is an extending direction of the electrical wire in which the electrical wire extends,
the inserted part includes an outer surface provided on a side opposite to the insertion surface, and
the insertion state maintaining part includes an inner wing part protruding toward the outer surface from a part of the insertion part passing through the inserted part to extend to an outer side of the outer surface.

* * * * *